(12) United States Patent
Nishibe et al.

(10) Patent No.: US 7,741,794 B2
(45) Date of Patent: Jun. 22, 2010

(54) LOAD DRIVE CONTROL CIRCUIT

(75) Inventors: Yasushi Nishibe, Aichi (JP); Hiroki Kishi, Aichi (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 177 days.

(21) Appl. No.: 12/142,196

(22) Filed: Jun. 19, 2008

(65) Prior Publication Data
US 2008/0315804 A1 Dec. 25, 2008

(30) Foreign Application Priority Data
Jun. 20, 2007 (JP) .............................. 2007-162711

(51) Int. Cl.
*H02P 7/00* (2006.01)
*H02H 3/00* (2006.01)

(52) U.S. Cl. ........................ 318/256; 318/254; 318/293; 318/294; 318/400.29; 361/23; 312/439

(58) Field of Classification Search ................ 318/254, 318/256, 293, 294, 400.29; 361/23; 312/439
See application file for complete search history.

(56) References Cited

U.S. PATENT DOCUMENTS

| 5,631,527 | A | * | 5/1997 | Canclini | ................ 318/400.29 |
| 5,642,247 | A | | 6/1997 | Giordano | |
| 5,818,180 | A | * | 10/1998 | Canclini | ................ 318/400.29 |
| 6,056,384 | A | * | 5/2000 | Sato et al. | ............... 318/400.21 |
| 6,864,651 | B1 | * | 3/2005 | Lee et al. | ..................... 318/280 |
| 6,989,643 | B2 | * | 1/2006 | Komaromi et al. | ..... 318/400.29 |
| 7,408,313 | B1 | * | 8/2008 | Kong et al. | .................. 318/293 |
| 2003/0151411 | A1 | * | 8/2003 | Tucker | ........................ 324/510 |

FOREIGN PATENT DOCUMENTS

JP 2006-158162 6/2006

* cited by examiner

*Primary Examiner*—Paul Ip
(74) *Attorney, Agent, or Firm*—Patterson, Thuente, Christensen, Pedersen, P.A.

(57) ABSTRACT

A load drive control circuit for controlling a load that includes connection terminals. The load drive control circuit includes bridge circuits respectively connected to the connection terminals of the load. Each bridge circuit includes two semiconductor elements, which are connected between a power supply and ground, and an output terminal. The semiconductor elements are each controlled to be switched between activated and deactivated states. The output terminal of each bridge circuit generates a bridge output that varies in accordance with a combination of the activated and deactivated states of the semiconductor elements in the bridge circuit. A detection circuit detects whether a short circuit is occurring in the connection terminals. A control circuit switches the bridge circuits to electrically disconnect the load from the power supply when a short circuit is occurring during a period in which the load is in a suspended state.

9 Claims, 6 Drawing Sheets

US 7,741,794 B2

LOAD DRIVE CONTROL CIRCUIT

BACKGROUND OF THE INVENTION

The present invention relates to a load drive control circuit for controlling the driving of a load such as a motor, a lamp, or the like.

In the prior art, a motor driver, such as a motor drive circuit, is used for driving a motor. Patent document 1 describes an H-bridge type motor drive circuit. FIG. 6 shows an H-bridge type motor drive circuit 81. The motor drive circuit 81 includes a first bridge circuit 83, which is connected to a first terminal M1 of a motor 82, and a second bridge circuit 84, which is connected to a second terminal M2 of the motor 82. The first bridge circuit 83 includes two series-connected transistors 85 and 86 connected in series. A node or an output terminal between the transistors 85 and 86 is connected to the first terminal M1 of the motor 82. The second bridge circuit 84 also includes two series-connected transistors 87 and 88. A node or an output terminal between the transistors 87 and 88 is connected to the second terminal M2 of the motor 82.

As shown in FIG. 7(a), the potential at the output terminal of the first bridge circuit 83 is high when the transistor 85, which is closer to the power supply Vcc, is activated and the transistor 86, which is closer to ground GND, is deactivated. In this state, the bridge output of the first bridge circuit 83 is high. As shown in FIG. 7(b), the potential at the output terminal of the first bridge circuit 83 is low (bridge output is low) when the transistor 85 is deactivated and the transistor 86 is activated. As shown in FIG. 7(c), the first bridge circuit 83 is in a high-impedance state (Hi-Z state) when the two transistors 85 and 86 are both deactivated. The operation of the second bridge circuit 84 is similar to the first bridge circuit 83.

In the situation shown in FIG. 8(a), the first bridge circuit 83 is in a high state, and the second bridge circuit 84 is in a low state. In this case, current flows from the activated transistor of the first bridge circuit 83 to the activated transistor of the second bridge circuit 84. As a result, the motor 82 is driven to produce forward rotation. In the situation shown in FIG. 8(b), the first bridge circuit 83 is in a low state, and the second bridge circuit 84 is in a high state. In this case, current flows from the activated transistor of the second bridge circuit 84 to the activated transistor of the first bridge circuit 83. As a result, and the motor 82 is driven to produce reverse rotation.

The motor drive circuit 81 is switched to a brake mode as shown in FIG. 8(c) or FIG. 8(d) to stop rotation produced by the motor 82. The two bridge circuits 83 and 84 are both in a low state in the brake mode of FIG. 8(c). The two bridge circuits 83 and 84 are both in a high state in the brake mode of FIG. 8(d).

A power supply leakage may occur for reasons such as condensation or a wiring abnormality depending on the usage state of the motor drive circuit 81. An example of a problem that may occur due to power supply leakage when switching both of the bridge circuits 83 and 84 to a low state to stop the rotation produced by the motor 82 will be described with reference to FIG. 9. In this example, the power supply leakage forms a power supply leakage resistor 89, and the first terminal M1 of the motor 82 is short circuited with the power supply Vcc due to such power supply leakage resistor 89. This is an accidental short circuit to a higher-potential point, or the power supply Vcc. Such a short circuit is herein referred to as higher potential point short circuit. Such a short circuit may cause overcurrent to flow from the power supply Vcc to the activated transistor (in FIG. 9, the transistor 86) in the first bridge circuit 83. This may damage the activated transistor.

A current detection circuit for detecting the flow of current to the motor drive circuit 81 (bridge circuits 83 and 84) or a voltage detection circuit for detecting the voltage applied to the motor 82 is used to protect the transistors of an H-bridge type motor drive circuit so that they are not damaged by overcurrent. A detection signal of the current detection circuit or voltage detection circuit is provided to a CPU. The CPU monitors the value of the current flowing to the motor drive circuit 81 based on the detection signal. When a higher potential point short circuit is detected, the CPU deactivates the transistors 85 and 86 in the bridge circuit (in FIG. 10, the first bridge circuit 83) located at the side in which the higher potential point short circuit occurred. Further, the CPU shifts the bridge circuit 83 located at the side in which the higher potential point short circuit occurred to a Hi-Z state, as shown in FIG. 10. Thus, the transistor 86 of the first bridge circuit 83 in which the higher potential point short circuit occurred is less likely to be damaged by overcurrent.

[Patent Document 1] Japanese Laid-Open Patent Publication No. 2006-158162

SUMMARY OF THE INVENTION

In FIG. 10, the bridge circuit 84 at the side in which the higher potential point short circuit has not occurred is in a low state, and the GND side transistor 88 in the bridge circuit 84 is activated. Thus, for example, if a higher potential point short circuit were to occur at the side of the first terminal M1 of the motor 82, the GND side transistor 88 of the second bridge circuit 84 at the side in which the higher potential point short circuit has not occurred is electrically connected to the power supply Vcc via the motor 82 and the power supply leakage resistor 89 and current flows from the power supply Vcc to the GND side transistor 88 via the power supply leakage resistor 89 even if the first bridge circuit 83 at the side in which the higher potential point short circuit occurred is set to the Hi-Z state to protect the GND side transistor 86. As a result, the motor 82 that should be maintained in a state in which operation is suspended is driven. Thus, further measures for solving this problem are required.

It is an object of the present invention to provide a load drive control circuit that prevents the occurrence of a situation in which overcurrent flows to the semiconductor elements in a load drive control circuit and prevents erroneous operations when a terminal of the load experiences a higher potential point short circuit during a period in which operation of the load is suspended.

One aspect of the present invention provides a load drive control circuit for controlling a load that includes connection terminals. The load drive control circuit includes bridge circuits respectively connected to the connection terminals of the load. Each bridge circuit includes two semiconductor elements, which are connected in series between a power supply and ground, and an output terminal, which is arranged between the two semiconductor elements and connected to one of the connection terminals of the load. The semiconductor elements are each controlled to be switched between an activated state and a deactivated state. The output terminal of each bridge circuit generates a bridge output that varies in accordance with a combination of the activated state and deactivated state of the two semiconductor elements in the bridge circuit. The drive control circuit switches the load to one of an operation suspended state, a forward direction driven state, and a reverse direction driven state in accordance with the combination of the bridge outputs of the bridge circuits. A detection circuit detects whether or not a higher potential point short circuit is occurring in at least one of the connection terminals of the load. A control circuit switches the bridge circuits to a high impedance state and electrically disconnects the load from the power supply when the detection circuit detects the occurrence of the higher potential point short circuit during a period in which the load is in the operation suspended state.

In such a structure, each bridge circuit is in a low state when operation of the load is suspended. When the detection circuit detects the occurrence of a higher potential point short circuit at the first terminal or second terminal of the load when operation of the load is suspended, the control circuit switches each bridge circuit from a low state to a high impedance state and electrically disconnects the load from the power supply. Thus, even if a higher potential point short circuit occurs at the first terminal of the load, overcurrent will not flow into the semiconductor elements of the bridge circuit since the bridge circuits are in the high-impedance state and the semiconductor elements of the bridge circuits are all deactivated. Furthermore, since the load is electrically disconnected from the power supply, current does not flow to the load even if a higher potential point short circuit occurs at the first terminal or second terminal of the load. This prevents the load from being erroneously operated by unexpected current.

When operation of the load is suspended, if a higher potential point short circuit occurs at the connection terminal of the load, the present invention prevents overcurrent from flowing into the semiconductor elements in the circuits driving the load. This prevents erroneous operation of the load.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

A load drive control circuit according to a preferred embodiment of the present invention will now be discussed with reference to FIGS. 1 to 5.

Figure 1:
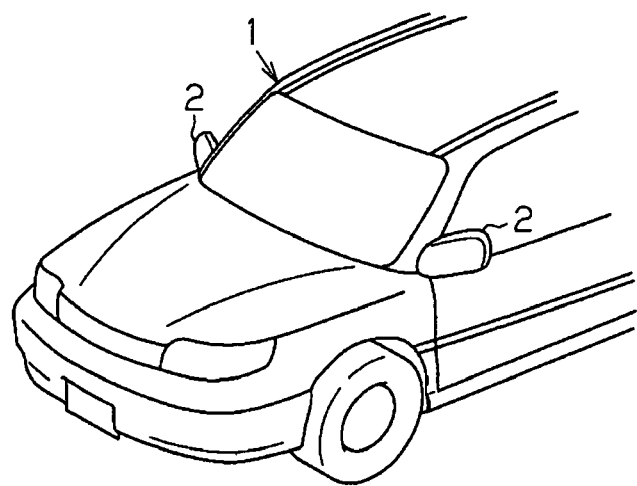
FIG. 1 is a perspective view showing a vehicle including a door mirror employing a motor drive circuit according to a preferred embodiment of the present invention.

As shown in FIG. 1, a vehicle 1 includes door mirrors (sideview mirrors) 2 arranged on the front doors. Each door mirror 2 folds, or opens and closes, when driven by a drive source such as a motor M (see FIG. 2). A door mirror switch 3 (see FIG. 2), which is arranged in the passenger compartment, is operated to open and close the door mirrors 2. For example, when the door mirrors 2 are in an open state, if the door mirror switch 3 is operated to fold or open the door mirrors 2, each door mirror 2 is turned toward the vehicle body and folded. When the door mirror 2 is in a folded state, if the door mirror switch 3 is operated to open or unfold the door mirrors 2, each door mirror 2 is turned away from the vehicle body and returned to the open state. The operations for opening and closing the door mirrors 2 may be performed under conditions such as whether or not the engine of the vehicle 1 is running. The motor M is one example of a load.

Figure 2:
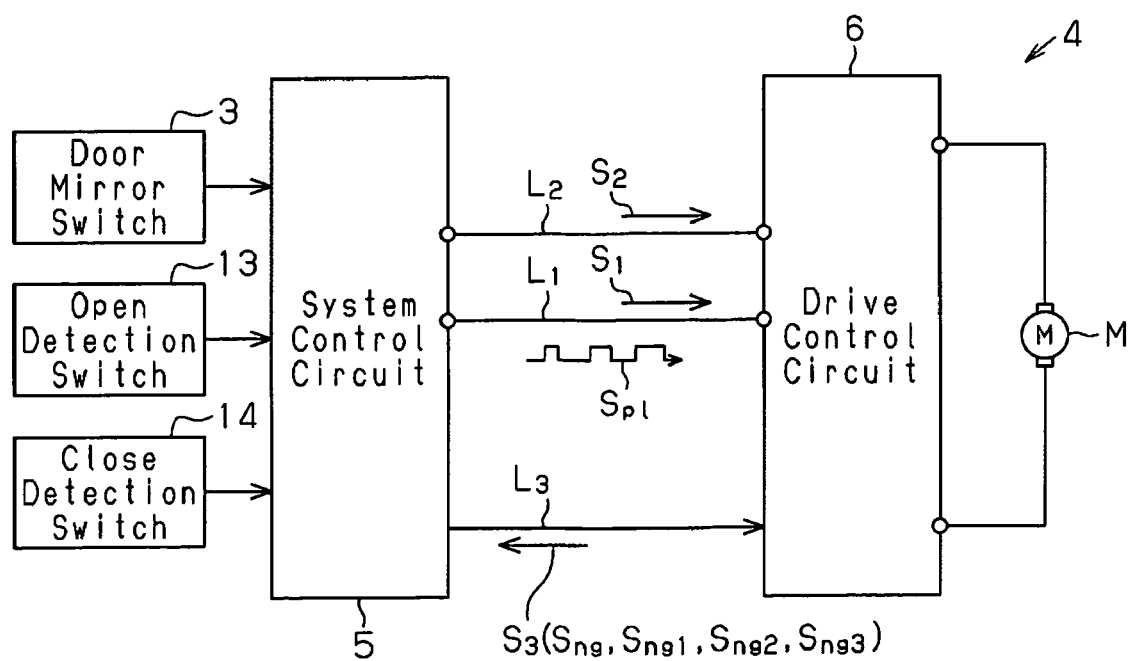
FIG. 2 is a block diagram of the motor drive circuit of the preferred embodiment.

The motor M for each door mirror 2 is driven by an H-bridge type motor drive circuit 4, which is shown in FIG. 2. The motor drive circuit 4 may be arranged in each door mirror 2. The motor drive circuit 4 includes a system control circuit 5 and a drive control circuit 6, which drives the motor M in accordance with a control command signal provided from the system control circuit 5. The system control circuit 5, which includes a CPU, ROM, and RAM, generates control command signals for switching the door mirror 2 between the open and closed states in response to the operation of the switch 3. The drive control circuit 6 includes a plurality of switching elements such as transistors. The plurality of switching elements of the drive control circuit 6 are activated or deactivated in accordance with the control command from the system control circuit 5. The activation and deactivation of the switching elements suspends operation of the motor M or produces forward or reverse rotation with the motor M. The motor drive circuit 4 is an example of a load drive control circuit. The system control circuit 5 is an example of a control circuit or a control means.

The system control circuit 5 is connected to the drive control circuit 6 in a communicable manner by an operation control line L1, a motor control line L2, and a diagnosis line L3. The system control circuit 5 provides the drive control circuit 6 with an activation command (operation control command signal S1) for activating the drive control circuit 6 through the operation control line L1. Further, the system control circuit 5 provides the drive control circuit 6 with an operation instruction command (motor control command signal S2) for specifying the operation (suspension, forward rotation, and reverse rotation) of the motor M through the motor control line L2. The system control circuit 5 receives an abnormality detection notification (diagnosis notification signal S3) from the drive control circuit 6 through the diagnosis line L3.

The system control circuit 5 outputs a standby request as the operation control command signal Si to the drive control circuit 6 through the operation control line L1 when an engine start switch is operated to an ACC position, IG position, or the like. If the drive control circuit 6 receives the standby request (S1) in a deactivated or inactive state, the operation mode of the drive control circuit 6 shifts to a standby mode to wait for the motor control command signal S2 from the system control circuit 5. If the system control circuit 5 detects the operation of the door mirror switch 3 after the drive control circuit 6 shifts to the standby mode, the system control circuit 5 generates the motor control command signal S2 that corresponds to the switch operation and provides the signal S2 to the drive control circuit 6 through the motor control line L2. The drive control circuit 6 suspends operation or produces forward or reverse rotation in each motor M in accordance with the motor control command signal S2.

Figure 3:
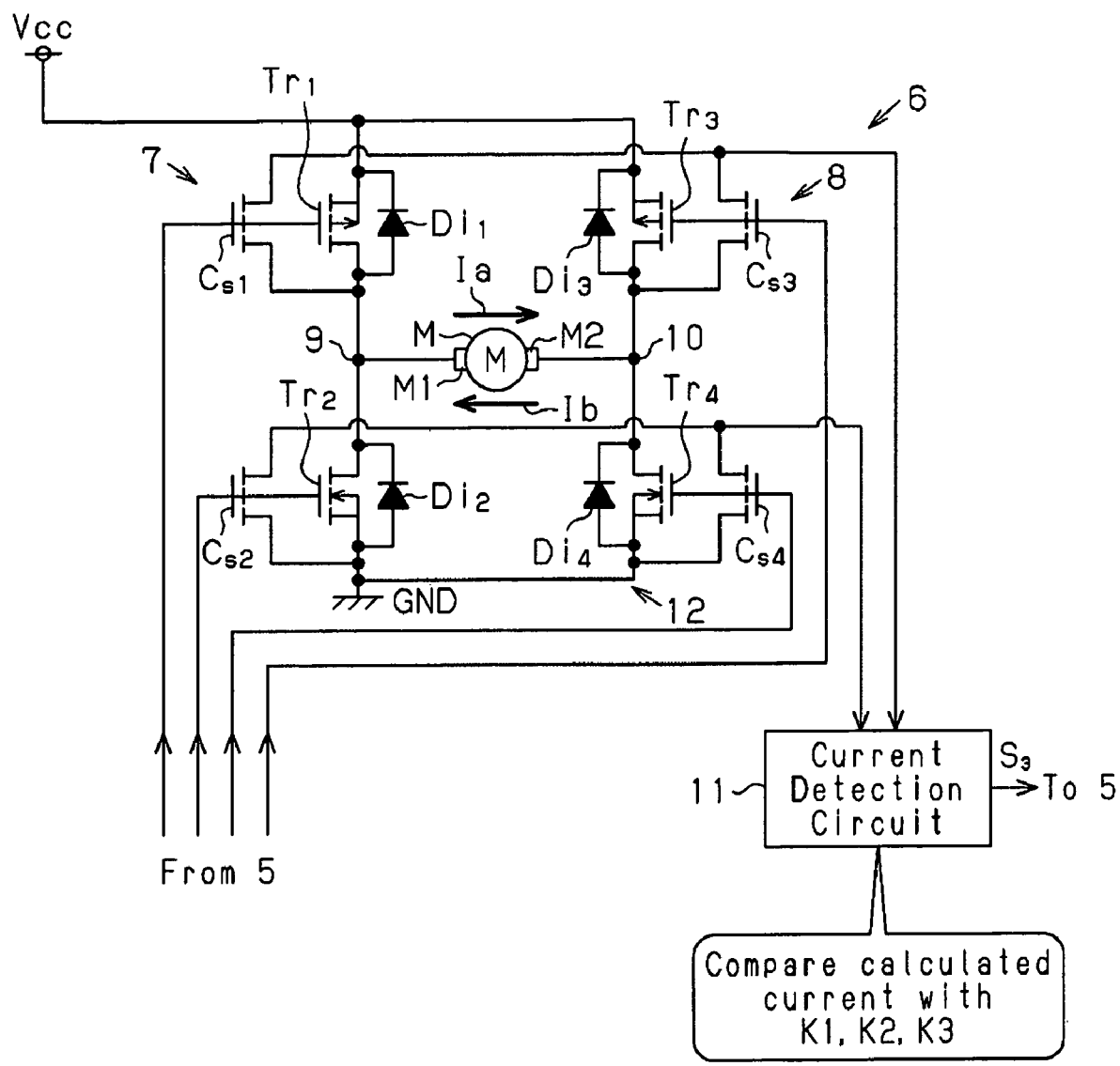
FIG. 3 is a circuit diagram of a drive control circuit for of the motor drive circuit of FIG. 2.

As shown in FIG. 3, the drive control circuit 6 includes a first bridge circuit 7, which is connected to a first terminal M1 (connection terminal) of the motor M, and a second bridge circuit 8, which is connected to a second terminal M2 of the motor M. The first bridge circuit 7 includes two series-connected transistors Tr1 and Tr2. A node (output terminal) 9 between the transistors Tr1 and Tr2 is connected to the first terminal M1 of the motor M. Each of the transistors Tr1 and Tr2 is, for example, a field effect transistor (FET). The transistor Tr1 is also referred to as a power supply (Vcc) side transistor. The transistor Tr2 is also referred to as a ground (GND) side transistor. The source terminal of the transistor Tr1 is connected to the power supply Vcc. The drain terminal of the transistor Tr1 is connected to the drain terminal of the transistor Tr2. The gate terminal of the transistor Tr1 is connected to the input terminal of the drive control circuit 6. The source terminal of the transistor Tr2 is connected to the GND. The gate terminal of the transistor Tr2 is connected to the input terminal of the drive control circuit 6. The first bridge circuit 7 and the second bridge circuit 8 are examples of a plurality of bridge circuits.

The second bridge circuit includes two series-connected transistors Tr3 and Tr4. A node (output terminal) 10 between the transistors Tr3 and Tr4 is connected to the second terminal M2 of the motor M. Each of the transistors Tr3 and Tr4 is, for example, an FET. The transistor Tr3 may is also referred to as a power supply side transistor. The transistor Tr4 is also referred to as a ground side transistor. The source terminal of the transistor Tr3 is connected to the power supply Vcc. The drain terminal of the transistor Tr3 is connected to the drain terminal of the transistor Tr4. The gate terminal of the transistor Tr3 is connected to the input terminal of the drive control circuit 6. The source terminal of the transistor Tr4 is connected to the GND. The gate terminal of the transistor Tr4 is connected to the input terminal of the drive control circuit 6. Each of the transistors Tr1 to Tr4 is an example of a semiconductor element.

When the power supply side transistors Tr1 and Tr3 of the bridge circuits 7 and 8 are activated and the GND side transistors Tr2 and Tr4 are deactivated, the bridge outputs of the two bridge circuits 7 and 8 are in a high state. When the power supply side transistors of the bridge circuits 7 and 8 are deactivated and the GND side transistors are activated, the bridge outputs of the two bridge circuits 7 and 8 are in a low state. When the power supply side transistor and the GND side transistor are both deactivated in each bridge circuit, each bridge circuit is in the Hi-Z state (high impedance state).

Diodes Di1 to Di4 are respectively connected to the transistors Tr1 to Tr4 to prevent the reverse flow of current into the transistors Tr1 to Tr4. The diodes Di1 to Di4 are connected in parallel to the corresponding transistor Tr1 to Tr4.

Each transistor Tr1 to Tr4 is activated or deactivated by the signal provided to its gate terminal. The signal is provided from, for example, the system control circuit 5.

When producing rotation in a first direction with the motor M, the system control circuit 5 activates the transistor Tr1, deactivates the transistor Tr2, deactivates the transistor Tr3, and activates the transistor Tr4. This shifts the first bridge circuit 7 to the high state and the second bridge circuit 8 to the low state. Further, the drive current Ia flowing from the first bridge circuit 7 to the second bridge circuit 8 is supplied to the motor M so that the motor M produces rotation in the first direction.

When producing rotation in a second direction with the motor M, the system control circuit 5 deactivates the transistor Tr1, activates the transistor Tr2, activates the transistor Tr3, and deactivates the transistor Tr4. This shifts the first bridge circuit 7 to the low state and the second bridge circuit 8 to the high state. Further, the drive current Ib flowing from the second bridge circuit 8 to the first bridge circuit 7 is supplied to the motor M so that the motor M produces rotation in the second direction.

When suspending operation of the motor M, the system control circuit deactivates the transistor Tr1, activates the transistor Tr2, deactivates the transistor Tr3, and activates the transistor Tr4. This shifts the first bridge circuit 7 to the low state and the second bridge circuit 8 to the low state. The potentials at both of the first and second terminals of the motor M become low. Thus, current does not flow to the motor M. This suspends operation of the motor M.

The system control circuit 5 controls the rotation produced by the motor M by executing power width modulation (PWM) control for modulating a pulse signal Sp1 that is output to the drive control circuit 6. The speed of the rotation produced by the motor M, or the rotation speed, is adjusted in accordance with the pulse width, pulse interval, pulse number, and the like of the pulse Sp1. Specifically, the PWM control changes the ratio of the ON time and OFF time of the switch element groups (Tr1 to Tr4) in the drive control circuit 6 by changing the pulse width, pulse interval, pulse number of pulses, and the like of the pulse signal Sp1 to control the voltage be applied to the motor M. When opening or closing the door mirror 2, the opening or closing speed of the door mirror 2 can be optimally controlled by executing the PWM control to drive-control the motor M.

The motor drive circuit 4 implements a protection function to protect the drive control circuit 6 from an abnormal state such as overcurrent. The protective function includes a heating protection control executed to protect the drive control circuit 6 from overheating, an overcurrent protection control executed to protect the drive control circuit 6 from overcurrent, and an overpower protection control executed to protecting the drive control circuit 6 from overpower. The protective function prevents the drive control circuit 6 (motor drive circuit 4) from being damaged even in an unexpected situation in which values of the drive control circuit 6 (motor drive circuit 4) exceed the upper limit temperature, rated current value, or rated power value.

Figure 4:
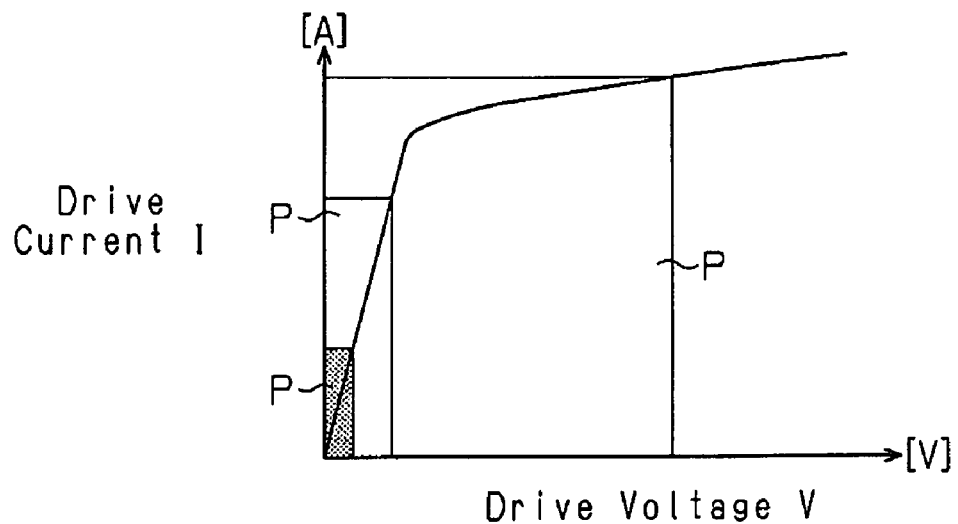
FIG. 4 is a graph showing the relationship between drive current and drive voltage.

The virtual voltage V of the drive control circuit 6 is unambiguously determined when the drive current I (Ia, Ib) flows to the drive control circuit 6. As apparent from the current-voltage characteristic curve shown in FIG. 4, the rate of increase in current is greater than the rate in increase in voltage (i.e., the inclination of the characteristic curve shown in FIG. 4 is large) when the current I starts to flow (i.e., when the current I is relatively small). The rate of increase in voltage becomes greater than the rate of increase in current (i.e., the inclination of the characteristic curve shown in FIG. 4 becomes small) from a predetermined point. The power consumption P of the drive control circuit 6 is calculated by multiplying the drive current I and the drive voltage V at any given point. Thus, detection of the current I flowing to the drive control circuit 6 enables determination of whether the drive control circuit 6 (motor drive circuit 4) is in a heated state, overcurrent state, or overpower state. The timing for starting the heating protection control, the overcurrent protection control, and the overpower protection control is determined based on the monitoring result of the current flowing to the drive control circuit 6.

As shown in FIG. 3, the drive control circuit 6 includes current detection transistors Cs1 to Cs4, which respectively detect the current flowing through the transistors Tr1 to Tr4, and a current detection circuit 11, which is connected to the current detection transistors Cs1 to Cs4. The current detection circuit 11 determines the amount of current flowing to the transistors Tr1 to Tr4 based on the detection signal provided from the current detection transistors Cs1 to Cs4. Each of the transistors Cs1 to Cs4 is, for example, a sense MOSFET. The set of current detection transistors Cs1 and Cs3, which correspond to the power supply side transistors Tr1 and Tr3, are connected by a wire to form a wire connection unit. The set of current detection transistors Cs2 and Cs4, which correspond to the GND side transistors Tr2 and Tr4, are connected by a wire to form a wire connection unit. Each wire connection unit is connected to the current detection circuit 11.

The current detection circuit 11 is hardware incorporated in the drive control circuit 6. The current detection circuit 11 has an input terminal, which is connected to the current detection transistors Cs1 to Cs4, and an output terminal, which is connected to the system control circuit 5. The current detection circuit 11 and the current detection transistors Cs1 to Cs4 are an example of a detection circuit or a detection means.

The current detection circuit 11 calculates the amount of current flowing to the drive control circuit 6 based on the detection signal provided from each wire connection unit of the current detection transistors Cs1 to Cs4. The current detection circuit 11 determines whether or not to activate a protective function in accordance with the calculated current amount. When activating a protective function, the current detection circuit 11 determines (selects) the protective function that is to be activated. For example, the current detection circuit 11 may determine activation of a protection control based on a rise in the drive current I, generate a protective function activation request signal Sng corresponding to the protection control that should be activated, and provide the protective function activation request signal Sng to the system control circuit 5 through the diagnosis line L3. The protective function activation request signal Sng is one of or a combination of a heating protection request signal Sng1, an overcurrent protection request signal Sng2, and an overpower protection request signal Sng3.

For example, the current detection circuit 11 determines activation of the heating protection control as the protective function when the calculated current amount exceeds a heating protection threshold value K1. In this case, the current detection circuit 11 provides the heating protection request signal Sng1 to the system control circuit 5. When receiving the heating protection request signal Sng1, the system control circuit 5 generates a pulse signal Sp1 having a relatively small first pulse width by executing PWM control and provides the generated pulse signal Sp1 to the drive control circuit 6. This reduces the drive current I flowing to the motor M and thereby reduces the heat generated in the drive control circuit 6.

The current detection circuit 11 determines activation of the overcurrent protection control as the protective function when the calculated current value exceeds an overcurrent threshold value K2 (K2>K1). In this case, the current detection circuit 11 provides the overcurrent protection request signal Sng2 to the system control circuit 5. When receiving the overcurrent protection request signal Sng2, the system control circuit 5 determines that heating protection control is insufficient for resolving the overcurrent state and thus generates a pulse signal Sp1 having a second pulse width smaller than the first pulse width by executing PWM control and provides the generated pulse signal Sp1 to the drive control circuit 6. This further reduces the drive current I flowing to the motor M thereby further reduces the heat generated in the drive control circuit 6.

The current detection circuit 11 determines activation of the overpower protection control as the protective function when the calculated current value exceeds an overpower threshold value K3 (K3>K2). In this case, the current detection circuit 11 provides the overpower protection request signal Sng3 to the system control circuit 5. When receiving the overpower protection request signal Sng3, the system control circuit 5 determines that the heating protection control and the overcurrent protection control are insufficient for resolving the overcurrent state and stops providing the pulse signal Sp1 to the drive control circuit 6. The stops the flow of the drive current I to the motor drive circuit.

Figure 5:
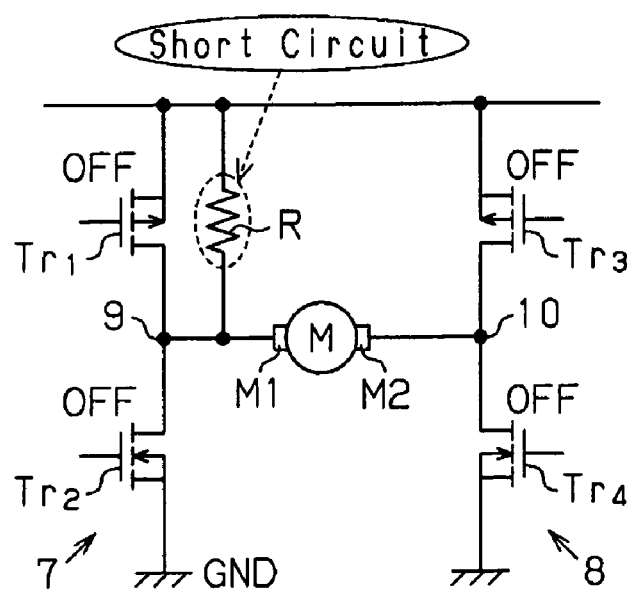
FIG. 5 is a circuit diagram of the motor drive circuit when a first terminal of the motor is short circuited with the power supply.
Figure 6:
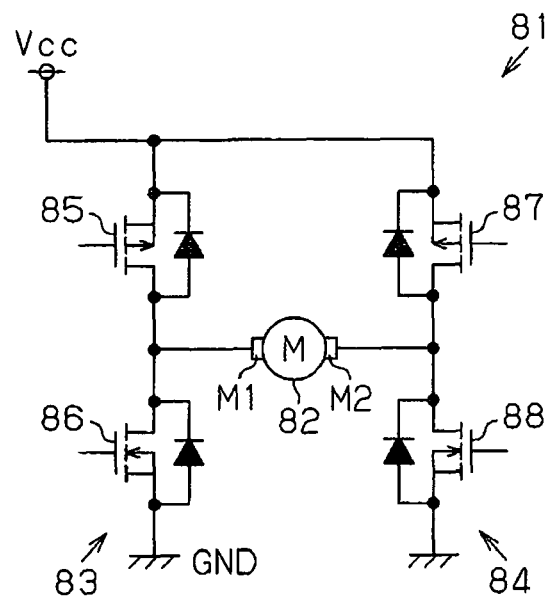
FIG. 6 is a circuit diagram of an H-bridge type motor drive circuit in the prior art.
Figure 7:
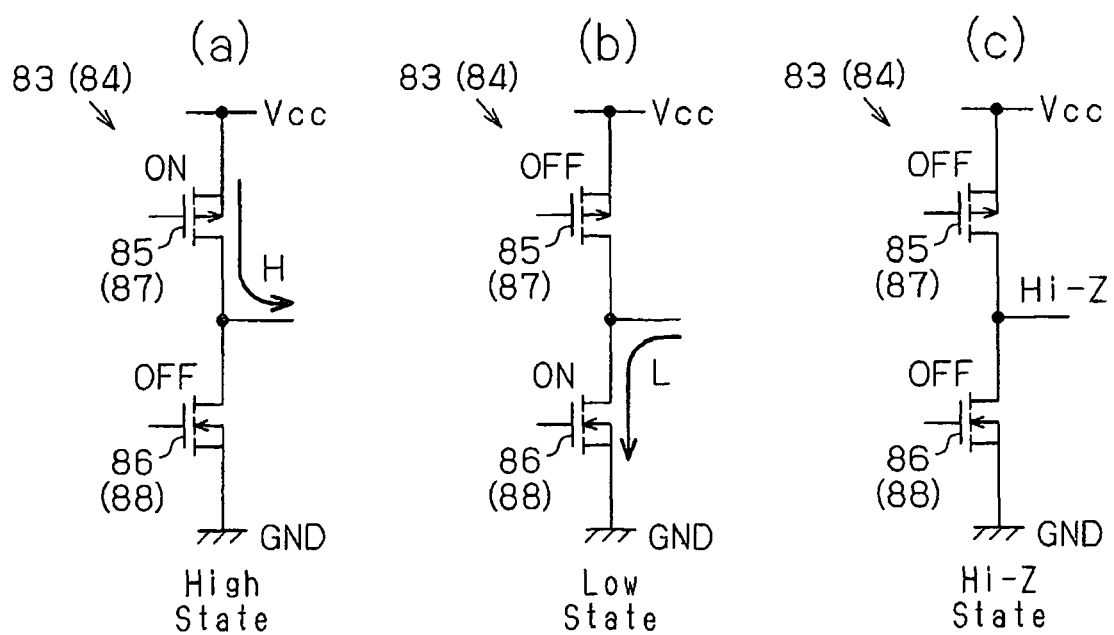
FIGS. 7(a) to 7(c) respectively show a high state, low state, and Hi-Z state of one bridge circuit in the motor drive circuit of FIG. 6.
Figure 8:
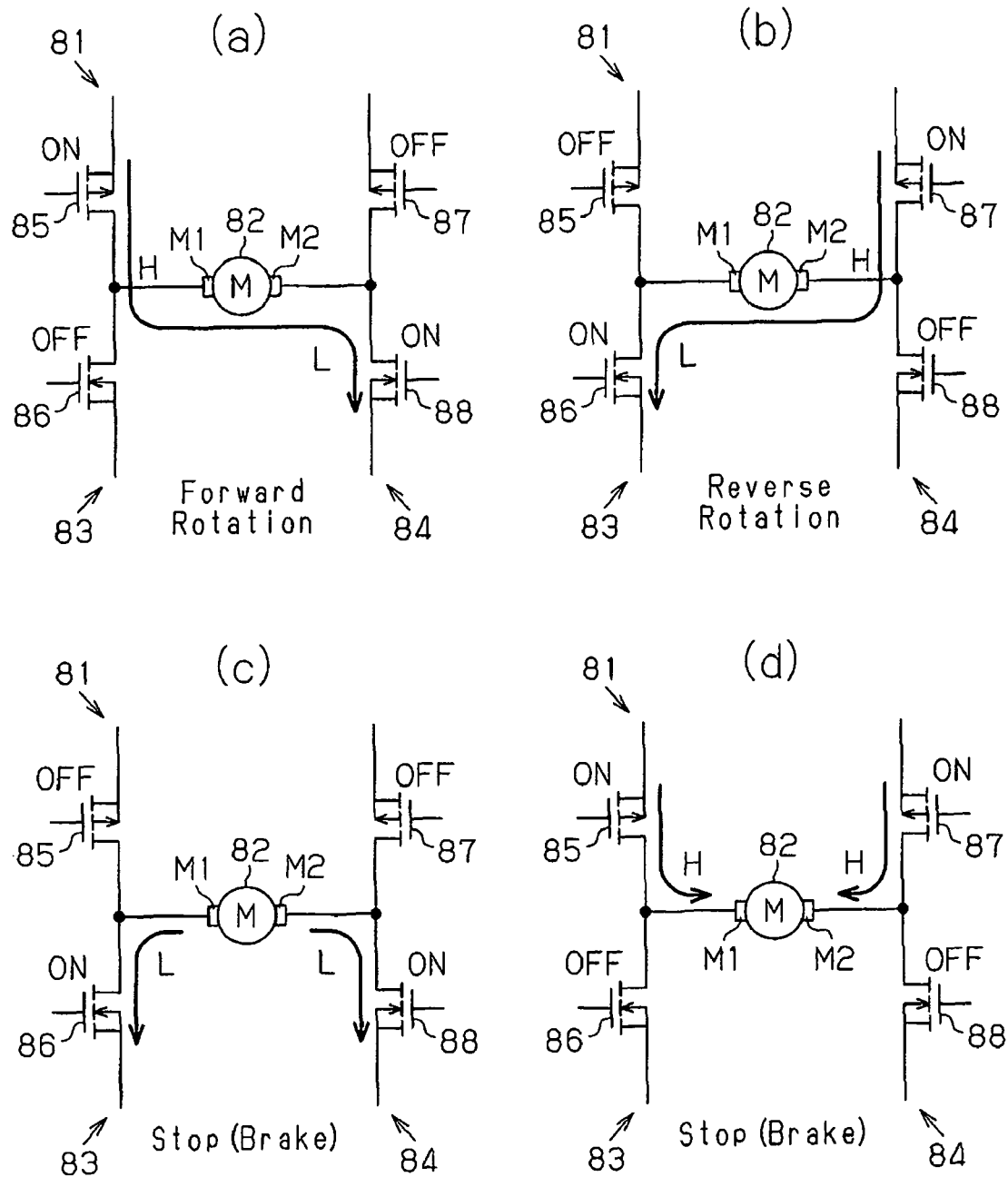
FIGS. 8(a) to 8(d) show various operations of the motor drive circuit of FIG. 6.
Figure 9:
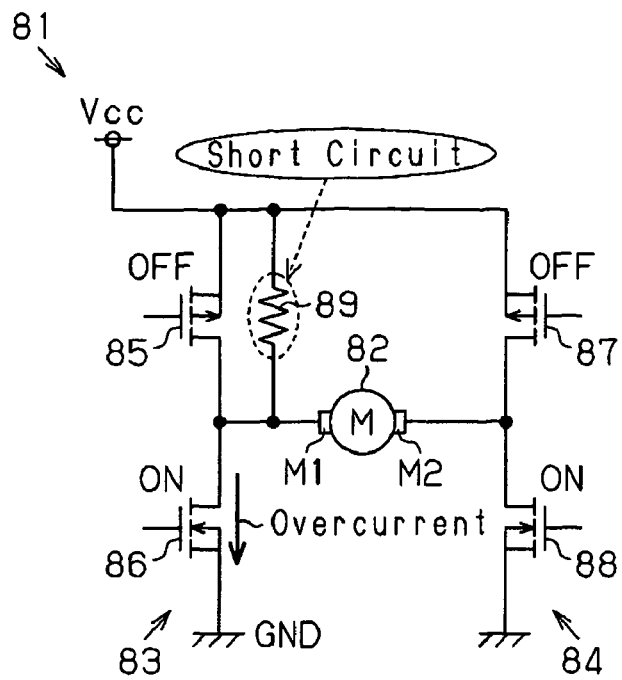
FIG. 9 shows overcurrent generated by a short circuit between a first terminal of the motor and a power supply in the motor drive circuit of FIG. 6.
Figure 10:
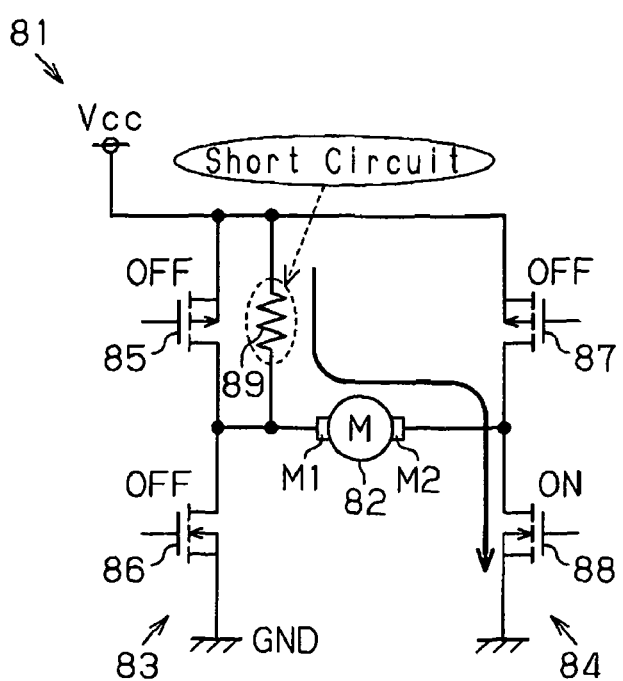
FIG. 10 shows an erroneous operation of the motor caused by a short circuit of the first terminal of the motor and the power supply in the motor drive circuit of FIG. 6.

The protective function activated when the motor M is not operating will be described below. Referring to FIG. 5, if a higher potential point short circuit occurs when the motor M is not operating, overcurrent may flow into the motor circuit 12 (see FIG. 3), which includes the motor M and the GND side transistors Tr2, Tr4. The language "a higher potential point short circuit" herein used refers to an accidental short circuit to a higher-potential point, or the power supply Vcc. To prevent such a situation, the motor drive circuit 4 executes higher potential point short circuit protection control. If the calculated current value of the current detection circuit 11 exceeds a higher potential point short circuit detection reference value or a higher potential point short circuit detection threshold value K (K>K3) when the motor M is not operating, the drive control circuit 6 provides a higher potential point short circuit protection request to the system control circuit 5 as the diagnosis notification signal S3. The system control circuit 5 receiving the higher potential point short circuit protection request shifts both of the first bridge circuit 7 and the second bridge circuit 8 from the low state to the Hi-Z state to electrically disconnect the motor M from the power supply Vcc.

The operation of the motor drive circuit 4 will now be described.

To open the door mirror 2 from a folded, state, the motor M must produce rotation in the first direction. In this state, the first bridge circuit 7 and the second bridge circuit 8 are both in the low state. Thus, the system control circuit 5 shifts the first bridge circuit 7 to the high state and keeps the second bridge circuit 8 in the low state. The drive current Ia directed from the first bridge circuit 7 to the second bridge circuit 8 flows to the motor M. Then, the motor M starts to produce rotation in the first direction so that the door mirror 2 starts to turn towards the outer side from the folded position.

When an open detection switch 13 (see FIG. 2) detects that the door mirror 2 has reached the open position when the motor M is producing rotation in the first direction, the system control circuit 5 shifts the first bridge circuit 7 back to the low state to stop the motor M. The low state of both of first bridge circuit 7 and the second bridge circuit 8 applies a break to the rotation of the motor M. Thus, the motor M stops operating when the door mirror 2 reaches the open position.

When folding the door mirror 2 from the open state, the system control circuit 5 shifts the second bridge circuit 8 to the high state while keeping the first bridge circuit 7 in the low state. The drive current Ib directed from the second bridge circuit 8 to the first bridge circuit 7 flows to the motor M.

Then, the motor M starts to produce rotation in the second direction so that the door mirror 2 starts to turn towards the inner side from the open position.

When a close detection switch 14 (see FIG. 2) detects that the door mirror 2 has reached the folded position when the motor M is producing rotation in the second direction, the system control circuit 5 shifts the second bridge circuit 8 back to the low state to stop the motor M. The low state of both of the first bridge circuit 7 and the second bridge circuit 8 applies a brake to the rotation of the motor M. Thus, the motor M stops operating when the door mirror 2 reaches the folded position. For example, a contact switch may be used as the open detection switch 13 and the close detection switch 14.

Depending on the usage state of the motor drive circuit 4, for example, a power supply leakage may occur due to reasons such as condensation or a wiring abnormality. Condensation or a wiring abnormality may cause a short circuit (higher potential point short circuit) between the first terminal M1 (terminal closer to the first bridge circuit 7) or second terminal M2 (terminal closer to the second bridge circuit 8) of the motor M and the power supply Vcc, as shown in FIG. 5. If such a higher potential point short circuit occurs when the motor M is not operating, overcurrent from the power supply Vcc flows to the GND side transistor (transistor Tr2 in FIG. 5) of the bridge circuit (first bridge circuit 7 in FIG. 5) at the side in which the higher potential point short circuit occurred through a power supply leakage resistor R. As a result, the overcurrent may damage the GND side transistor.

However, in the drive control circuit 6 of the embodiment, when the current detection circuit 11 detects that the current flowing through the motor circuit 12 has exceeded the higher potential point short circuit detection threshold value L when the motor M is not operating, the current detection circuit 11 provides the higher potential point short circuit protection request to the system control circuit 5 as the diagnosis notification signal S3. The system control circuit 5 shifts both of the first bridge circuit 7 and the second bridge circuit 8, which are in the low state, to the Hi-Z state in response to the higher potential point short circuit protection request. This electrically disconnects the motor M from the power supply Vcc. Thus, if a higher potential point short circuit were to occur at the first terminal M1 of the motor M, overcurrent would not be generated in the motor drive circuit 4 (drive control circuit 6) since the transistors Tr1 to Tr4 are all deactivated. This prevents damages from being inflicted to transistors since overcurrent is not generated.

When a higher potential point short circuit occurs at the terminal M1 or M2 of the motor M, in addition to the first bridge circuit 7, the second bridge circuit 8 is also shifted to the Hi-Z state. This electrically disconnects the first bridge circuit 7 and the second bridge circuit 8 from the power supply Vcc. Thus, current flowing from the power supply Vcc of the motor drive circuit 4 through the power supply leakage resistor R towards the bridge circuit (second bridge circuit 8 in FIG. 5) at the side in which the higher potential point short circuit has not occurred is less likely to be generated even if the higher potential point short circuit occurs at the first terminal Ml of the motor M. This prevents the motor M from producing unexpected rotation when the motor M is not operating. As a result, unexpected rotation of the motor M, that is, unexpected movement of the door mirror 2 from the folded position or open position is prevented.

If the door mirror switch 3 is operated so as to generate an open request when the terminal M1 of the motor M closer to the first bridge circuit 7 is higher potential point short circuited, the current generated by the higher potential point short circuit produces rotation in the first direction with the motor M, and the door mirror 2 turns from the folded position to the open position. If the door mirror switch 3 is operated so as to generate a fold request when a higher potential point short circuit is occurring, the motor M remains stopped since there is no potential difference between the terminals M1 and M2 of the motor M. Thus, the door mirror 2 does not operate. Since the door mirror 2 does not operate, the operator becomes aware of the operation failure of the door mirror 2, that is, the terminal of the motor M being higher potential point short circuited. This leads to the operator acknowledging the necessity for repair of the door mirror 2.

The embodiment has the advantages described below.

(1) The motor drive circuit 4 executes the higher potential point short circuit protection control for shifting the two bridge circuits 7 and 8, which supply the drive current to the motor M, to the Hi-Z state if detecting that the terminal of the motor is higher potential point short circuited when the motor is not operating. During the execution of the higher potential point short circuit protection control, the transistors Tr1 to Tr4 of the bridge, circuits 7 and 8 are all deactivated even if current generated by a higher potential point short circuit flows from the power supply Vcc to the motor circuit 12. Thus, current I does not flow to the transistors Tr1 to Tr4. This prevents damages from being inflicted to the transistor by overcurrent. Upon detection of a higher potential point short circuit, the two bridge circuits 7 and 8 are shifted to the Hi-Z state and the motor M is disconnected from the power supply Vcc. Thus, current generated by a higher potential point short circuit does not flow to the motor M. This prevents the motor M from producing unexpected rotation.

(2) The rotation produced by the motor M is controlled through execution of the PWM control. The PWM control is advantageous in that the energy conversion rate of the switching control is satisfactory and the switching control is simple.

(3) When suspending operation of the motor M, the motor drive circuit 4 shifts the two bridge circuits 7 and 8 to the low state. This is advantageous from the viewpoint of stability since the two terminals of the motor M are not shifted to a high potential when the motor M is not operating when executing a control that suspends operation of the motor M by shifting the two bridge circuits 7 and 8 to a high state.

It should be apparent to those skilled in the art that the present invention may be embodied in many other specific forms without departing from the spirit or scope of the invention. Particularly, it should be understood that the present invention may be embodied in the following forms.

The detection means is not limited to a current detection type, which uses the current detection transistors Cs1 to Cs4 and the current detection circuit 11, and may be, for example, a voltage detection type that detects the voltage of the motor circuit 12 and detects the occurrence of a ground short circuit when the voltage is abnormal.

A thermistor etc. may be used in lieu of the current detection transistors Cs1 to Cs4.

The transistors Cs1 to Cs4 are not limited to sense MOSFETs and may be bipolar transistors.

The semiconductor element is not necessarily limited to FETs (transistors Tr1 to Tr4) and any of various types of switching elements may be used.

The protective functions are not limited to overheating protection, overcurrent protection control, and overpower protection control. Further, the contents of a protective function is not particularly limited as long as it capable of avoiding an abnormal circuit state in the motor circuit 12.

The load is not limited to the motor M and may be, for example, a lamp.

The rotation control of the motor M does not need to be the PWM control, and other pulse controls may be executed instead.

The higher potential point short circuit protection control may also be executed together with the heating protection control (threshold value K1), the overcurrent protection control (threshold value K2), or the overpower protection control (threshold value K3).

The motor drive circuit 4 is not limited to the H-bridge type and may be a three-bridge drive circuit for drive controlling two motors with three bridge circuits. The three bridge motor drive circuit is a drive circuit in which each one of the three bridge circuits is exclusively used for one motor, another one of the bridge circuits is exclusively used for another motor, and the remaining one of the bridge circuit is commonly used for the two motors.

The motor drive circuit 4 is not limited to the door mirror 2 having a motor for automatic opening and closing and may be used for any equipment or device that has a motor.

The present examples and embodiments are to be considered as illustrative and not restrictive, and the invention is not to be limited to the details given herein, but may be modified within the scope and equivalence of the appended claims.

What is claimed is:

1. A load drive control circuit for controlling a load that includes connection terminals, the load drive control circuit comprising:
    bridge circuits respectively connected to the connection terminals of the load, with each bridge circuit including two semiconductor elements, which are connected in series between a power supply and ground, and an output terminal, which is arranged between the two semiconductor elements and connected to one of the connection terminals of the load, wherein the semiconductor elements are each controlled to be switched between an activated state and a deactivated state, the output terminal of each bridge circuit generates a bridge output that varies in accordance with a combination of the activated state and deactivated state of the two semiconductor elements in the bridge circuit, and the drive control circuit switches the load to one of an operation suspended state, a forward direction driven state, and a reverse direction driven state in accordance with the combination of the bridge outputs of the bridge circuits;
    a detection circuit for detecting whether or not a higher potential point short circuit is occurring in at least one of the connection terminals of the load; and
    a control circuit for switching the bridge circuits to a high impedance state to electrically disconnect the load from the power supply when the detection circuit detects the occurrence of the higher potential point short circuit during a period in which the load is in the operation suspended state.

2. The load drive control circuit according to claim 1, wherein:
    the semiconductor elements of each bridge circuit include a power supply side semiconductor element connected to the power supply and a ground side semiconductor element connected to the ground; and
    the control circuit deactivates the power supply side semiconductor element and activates the ground side semiconductor element in each bridge circuit to shift the bridge output of the plurality of bridge circuits to a low potential state when suspending operation of the load.

3. The load drive control circuit according to claim 1, wherein the control circuit controls a pulse signal provided to at least a selected one of the semiconductor elements of the plurality of bridge circuits, controls the switching of said semiconductor element, and controls the driving of the load.

4. The load drive control circuit according to claim 1, wherein the detection circuit is of a current detection type which detects the amount of current flowing to the load and provides the control circuit with a higher potential point short circuit protection request when the detected current exceeds a threshold value.

5. The load drive control circuit according to claim 1, wherein the detection circuit is a heat detection circuit which detects heat in the load and provides the control circuit with a higher potential point short circuit protection request when the detected heat exceeds a threshold value.

6. The load drive control circuit according to claim 1, wherein the detection circuit is a power detection circuit which detects power of the load and provides the control circuit with a higher potential point short circuit protection request when the detected power exceeds a threshold value.

7. The load drive control circuit according to claim 1, wherein the load is a motor.

8. The load drive control circuit according to claim 1, wherein the higher potential point short circuit is an accidental shot circuit between the power supply and at least one of the connection terminals of the load.

9. A load drive control circuit for controlling a load that includes a first terminal and a second terminal, the load drive control circuit comprising:
    a first bridge circuit connected between a power supply and ground, the first bridge circuit including a first power supply side transistor and a first ground side transistor, which are connected in series, and a first output terminal arranged between the first power supply side transistor and the first ground side transistor and connected to the first terminal of the load;
    a second bridge circuit connected between the power supply and the ground, the second bridge circuit including a second power supply side transistor and a second ground side transistor, which are connected in series, and a second output terminal arranged between the second power supply side transistor and the second ground side transistor and connected to the second terminal of the load;
    a detection circuit for detecting whether or not an unexpected current increase or voltage rise is occurring in at least one of the connection terminals of the load; and
    a control circuit for generating a control signal that deactivates the first power supply side transistor, first ground side transistor, second power supply side transistor, and second ground side transistor and electrically disconnects the load from the power supply when the detection circuit detects the occurrence of an unexpected current increase or voltage rise at the first terminal of the load during a period in which the load is in a suspended state.

* * * * *